United States Patent [19]

Tamaru et al.

[11] 4,122,531

[45] Oct. 24, 1978

[54] MEMORY AND CONTROL CIRCUIT FOR THE MEMORY

[75] Inventors: Keikichi Tamaru, Fujisawa; Yukimasa Uchida, Yokohama, both of Japan

[73] Assignee: Tokyo Shibaura Electric Company, Limited, Kawasaki, Japan

[21] Appl. No.: 753,020

[22] Filed: Dec. 21, 1976

[30] Foreign Application Priority Data

Dec. 25, 1975 [JP] Japan .................. 50-156941

[51] Int. Cl.$^2$ .............................................. G11C 9/06
[52] U.S. Cl. .................................. 364/900; 365/238
[58] Field of Search ...... 340/173 R, 173 CA, 173 SP; 364/200 MS File, 900 MS File

[56] References Cited

U.S. PATENT DOCUMENTS

| 3,699,535 | 10/1972 | Klein ................................. 364/200 |
| 3,895,360 | 7/1975 | Cricchi et al. ..................... 364/900 |
| 3,916,390 | 10/1975 | Chang et al. ................. 340/173 CA |

Primary Examiner—Gareth D. Shaw
Assistant Examiner—Thomas M. Heckler

Attorney, Agent, or Firm—Cushman, Darby & Cushman

[57] ABSTRACT

A memory and control circuit for the memory with a memory including a first memory plane area having a plurality of memory cells arranged in a matrix array and a plurality of second memory plane areas each having a plurality of nonvolatile memory cells arranged in a matrix array, the first memory plane area being arranged in a superposed relation to the second memory plane area and the memory cell in the first memory plane area being connected to the corresponding memory cell in the second memory plane area; first control lines connected to the second memory plane areas; a first control circuit for selectively driving the control lines to energize the memory cells in the corresponding second memory plane area; a second control line connected to the first memory plane area; and a second control circuit adapted to selectively energize the memory cells of the first memory plane area through the second control line to permit data transfer between the selected memory cell in the first memory plane area and that corresponding memory cell in the second memory area which is energized through the first control line.

13 Claims, 7 Drawing Figures

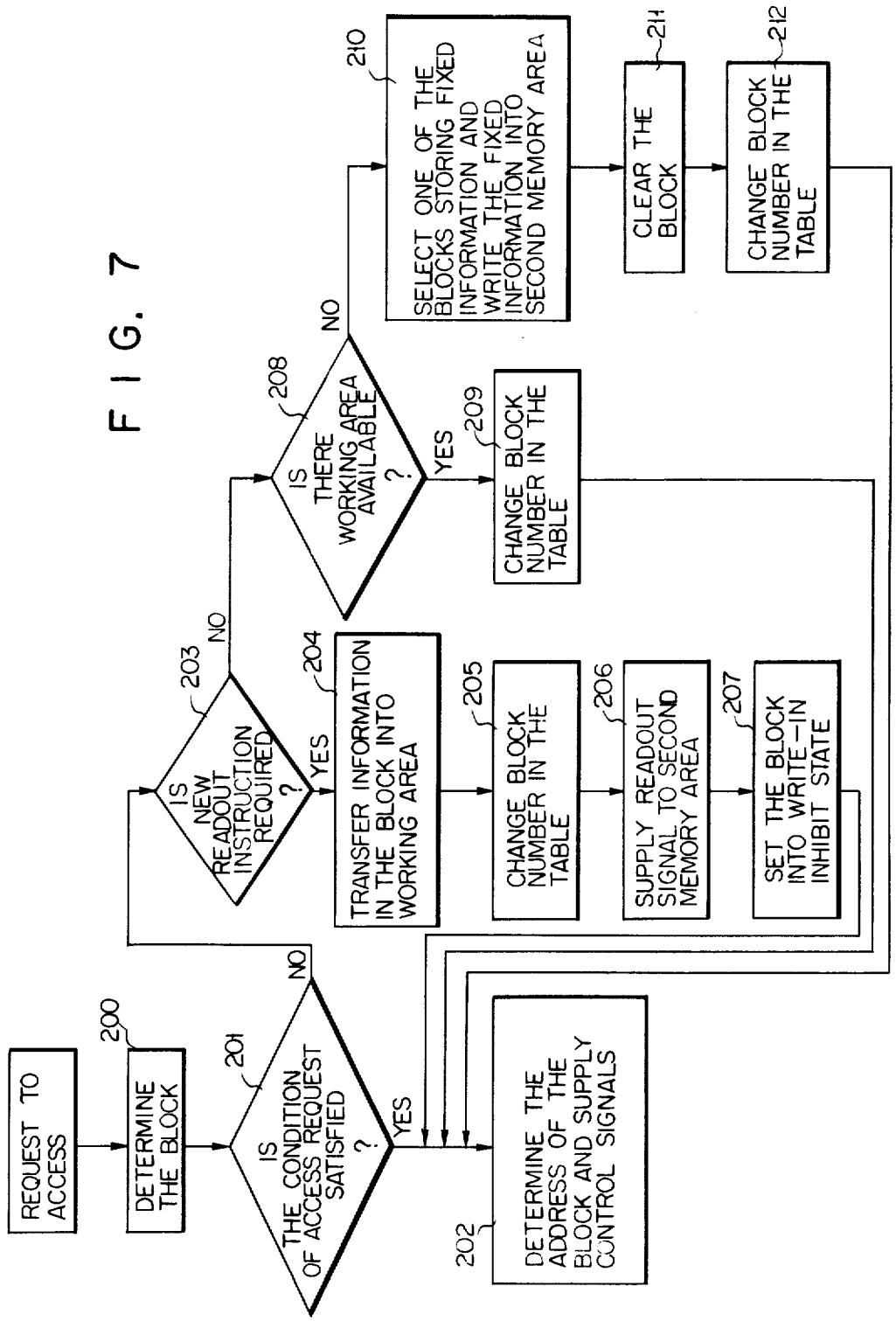

MEMORY AND CONTROL CIRCUIT FOR THE MEMORY

BACKGROUND OF THE INVENTION

This invention relates to a memory and control circuit for the memory and in particular to a memory and control circuit for the memory equipped with a memory having a plurality of memory plane areas.

A memory as conventionally used in a computer can be considered to be a type of memory having a word X bit memory plane area in general. Such a memory can designate any one particular memory location by designating any particular bit of any particular word. The memory of this type is constructed of a read/write type memory cell array, for example, a random access memory array and a peripheral device including an address decoder, driver, readout amplifier and control circuit.

A conventional electronic computer uses a memory having a single memory plane. When data to be stored consist of N words, each word consisting of M bits, it was necessary to provide a plane memory having an N bit x M bit memory capacity. Along with the development of computer technology, it has been required to increase the memory capacity of an electronic computer with attendant increase in the occupation area of the memory. The price of the memory is an appreciable cost in the manufacture of the computer.

SUMMARY OF THE INVENTION

It is accordingly the object of this invention to provide a memory and control circuit for the memory equipped with a memory having a plurality of memory plane areas, in which data can be effectively processed.

According to one embodiment of this invention there is provided a memory and control circuit for the memory comprising a memory including a first memory plane area having a plurality of memory cell elements and a plurality of second memory plane areas each having a plurality of nonvolatile memory cell elements, the memory cell element in the first memory plane area being connected to the corresponding memory plane area in each of the second memory plane areas; first selection lines connected to the first memory plane area to select the memory cell element of the first memory plane area; second selection lines connected to the second memory plane areas to select the second memory plane area; and a control circuit adapted to selectively drive the first and second selection lines to permit data transfer between the first and second memory plane areas.

The first and second memory plane areas are divided into a plurality of blocks and data transfer between the first and second memory plane areas is effected for each block.

BRIEF DESCRIPTION OF THE DRAWING

This invention will be further described by way of example by referring to the accompanying drawings in which:

FIG. 7 is a flow chart showing a more automated data processing.

DETAILED DESCRIPTION OF THE INVENTION

Figure 1:
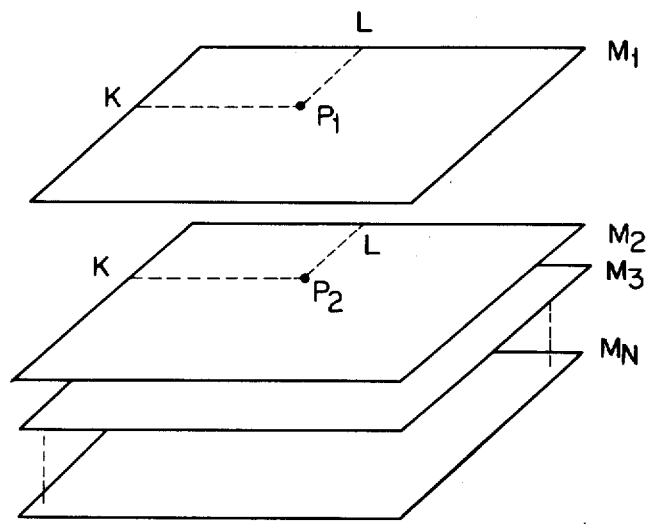
FIG. 1 is a model showing a memory having a plurality of memory plane areas which can be used in this invention.

FIG. 1 shows a memory having memory plane areas $M_1$ to $M_N$. The first memory plane area $M_1$ is constituted by a random access memory and the remaining memory plane areas $M_2$ to $M_N$ are constituted by nonvolatile memories. A memory cell in a Kth-word Lth-bit position $P_1$ of the first memory plane area $M_1$ corresponds to a memory cell located in the Kth-word Lth-bit positions $P_2$ to $P_N$ of the memory plane areas $M_2$ to $M_N$. That is, each of the memory cells of the first memory plane area $M_1$ is arranged in a one-to-one correspondence with respect to the memory cells of the memory plane areas.

In the memory shown in FIG. 1 a data on the first memory plane area $M_1$, for example, a bit on a memory cell in the position $P_1$ of the memory plane area $M_1$ are written according to a write control signal onto, for example, a memory cell in the position $P_2$ on the second memory plane area $M_2$. The data written onto the second memory plane area $M_2$ are maintained without being influenced from change in the state of the first memory plane area $M_1$, unless a write control signal is applied to the corresponding memory cell on the memory plane area $M_2$. That is, the first memory plane area $M_1$ can be freely used without exerting any influence on the memory plane areas $M_2$ to $M_N$. When a power supply is interrupted, the data on the first memory plane area $M_1$ disappears, but the memory state of the other memory plane areas $M_2$ to $M_N$ is maintained. When the power supply is again rendered ON an indefinite state is established in the first memory plane area $M_1$, but the memory plane areas $M_2$ to $M_N$ establish the previous memory states. When a readout control signal is applied to the memory cell in one of the memory plane areas $M_2$ to $M_N$ data on the memory cells are read out into corresponding memory cells of the memory plane area $M_1$. In this case, the data on the predetermined memory cells of the memory plane areas $M_2$ to $M_N$ are held. The data on the memory cell of the memory plane areas $M_2$ to $M_N$ can be erased by applying an erase signal. It is to be noted, however, that if "0" and "1" can be written onto the memory cell of the memory plane areas, no erase control operation is required.

Figure 2:
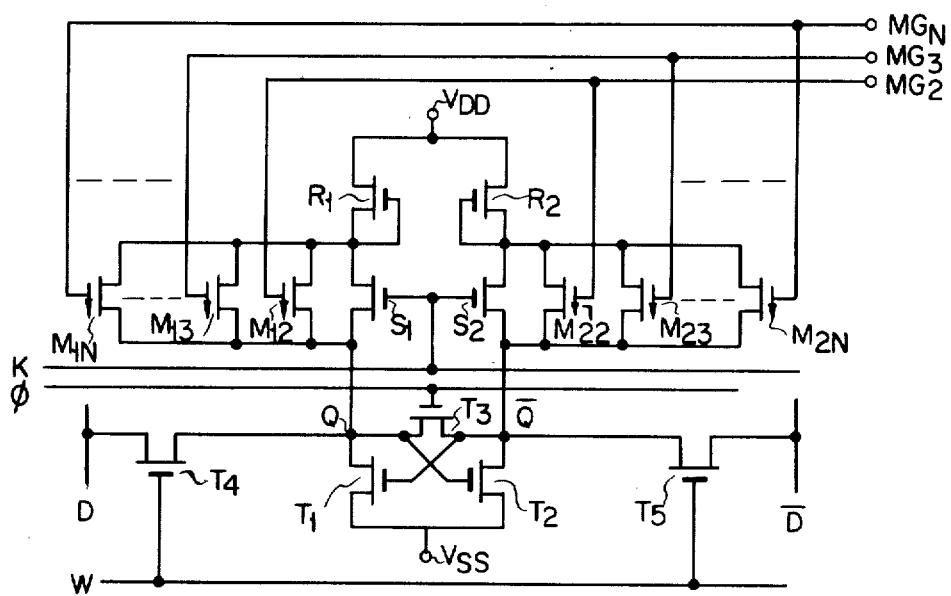
FIG. 2 is a circuit diagram showing one memory cell of the memory in FIG. 1.

Two kind of memories have been proposed to date. One memory is so constructed as to have a nonvolatile memory characteristic. As shown in FIG. 2, for example, it comprises a memory cell element constituted by a flip-flop circuit having MOS FET transistors $T_1$, $T_2$, $S_1$, $S_2$, $R_1$, $R_2$ and nonvolatile memory cell elements having pairs of MNOS FET transistors $M_{12}$ and $M_{22}$, $M_{13}$ and $M_{23}$, and ... $M_{2N}$. The other memory is so constructed that a memory cell is comprised of an ordinary semiconductor RAM and a data are held by using an auxiliary power supply such as a battery etc. In this case, it is possible to prevent data on the memory plane area $M_1$ from being erased due to the interruption of a main power supply. This imparts no essential influence to the action of the memory. In the memory of FIG. 2, when a readout operation is effected, a signal is applied through MNOS FET's $S_1$ and $S_2$ to render the same conductive.

Among memory data there are two types of data, one being a fixed data stored without being varied for a predetermined time period and repeatedly read out and the other being a temporary data which is temporarily stored, as formed in a data representing an intermediate result of calculation, and immediately disappears. The fixed data are stored without being varied, for example, during the time period from the start to the end of a job and a read only memory is used to deal with a fixed data which is not varied over a length of time substantially equal to, for example, the lifetime of a computer.

Let us explain a method for storing such temporary and fixed data in the plurality of memory plane areas in FIG. 1.

Figure 3:
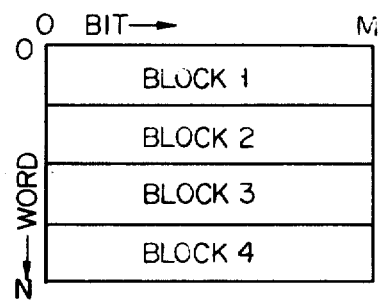
FIG. 3 is an explanatory view showing the memory plane area of the FIG. 1 memory which is divided into a plurality of blocks.

As shown in FIG. 3, for example, the memory plane area is divided in a word direction into, for example, four blocks. Mutually related fixed data are collected in the same block and the fixed data in one block are separated from the fixed data on another block. The fixed data in the same block is stored in the second memory plane area through the first memory plane area. The gate terminals MGi of all the MNOS FET's $M_1i$, $M_2i$ arranged in the same block are connected to a common gate control line and are so controlled that data can be transferred between the first and second memory plane areas at one time.

Figure 4:
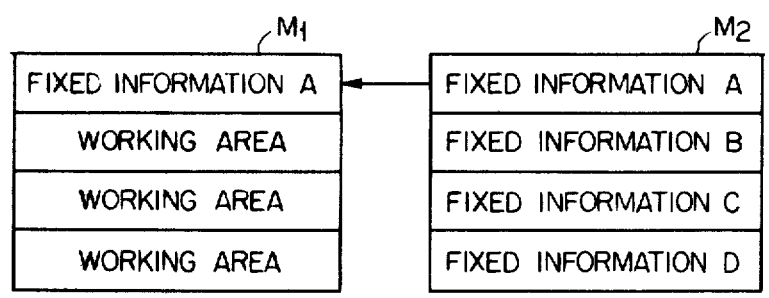
FIGS. 4 and 5, each, are an explanatory view showing a data transfer between first and second memory plane areas of the memory in FIG. 1.
Figure 5:
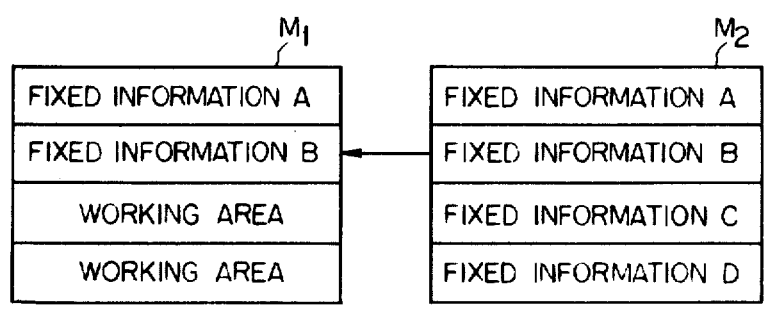

When a computer starts its processing operation, as shown in FIG. 4 access is made to the block 1 storing the fixed data A for use in a job to be processed by the computer. That is, the fixed data A in the block 1 of the memory plane area $M_2$ is transferred to the block 1 of the memory plane area $M_1$. The fixed data A is read out according to a readout instruction from the block 1 of the memory plane area $M_1$ and fed to a processing unit (not shown).

Since no address instruction is given to the blocks 2, 3, 4, fixed data B, C and D remains stored in the blocks 2, 3 and 4 of the memory plane area $M_2$ and the blocks 2, 3 and 4 of the first memory plane area $M_1$ are unoccupied for processing a temporary data. The processing unit utilizes the unocuppied blocks 2, 3 and 4 of the memory plane area $M_1$ as working memory areas and processes the data A in the block 1.

When further processing operation requires a fixed data B, the fixed data B in the block 2 of the memory plane area $M_2$ is read out according to a corresponding address data onto the block 2 of the first memory plane area $M_1$. In this case, the blocks 3 and 4 are used as working memory areas for processing temporary data and the processing unit processes the fixed data A and B.

If, with further processing operation, a fixed data C is required but the fixed data A becomes unnecessary, then the fixed data in the block 3 of the memory plane area $M_2$ is read out onto the block 3 of the memory plane area $M_1$ and at the same time the block 1 of the memory plane area $M_1$ is cleared and used as a working memory area. In this way, the blocks 1 to 4 of the first memory plane area $M_1$ permit such fixed and temporary data to be selectively processed according to the instruction signals of the processing unit.

Figure 6:
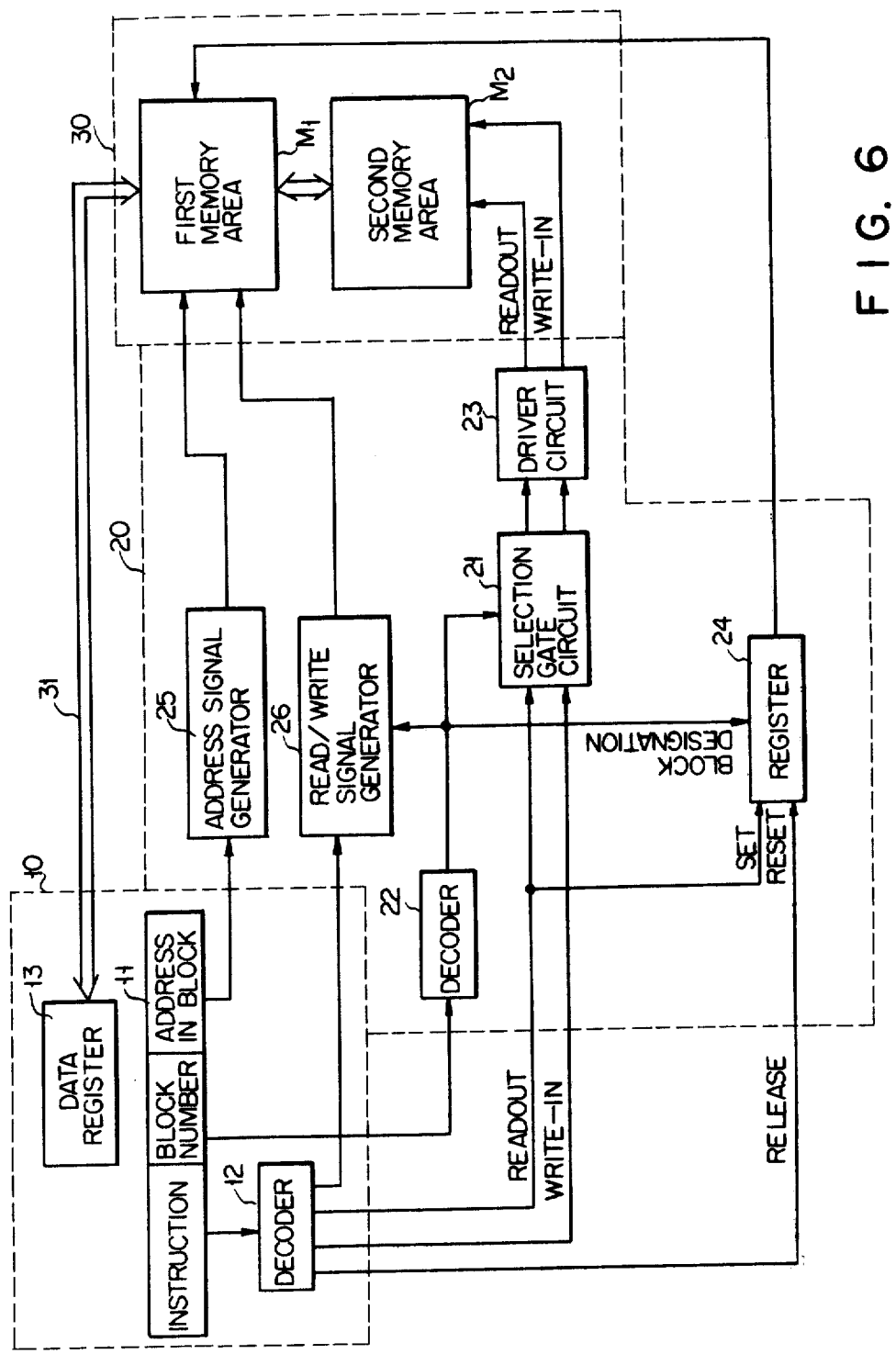
FIG. 6 is a circuit diagram showing a memory and control circuit for the memory according to one embodiment of this invention.

When a computer is constructed to have a memory adapted to perform the above-mentioned functions there will be required a specific control circuit for controlling the memory, such as a control circuit 20 as shown, for example, in FIG. 6. In this case, a program is prepared as including a readout instruction RPL for reading out a fixed data in one of the second memory plane areas $M_2$ to $M_N$ onto the first memory plane area so as to permit a memory space to be effectively used. The readout instruction RPL is used to designate any particular block and second memory plane area.

In FIG. 6 an instruction data of an instruction register 11 in the processing unit 10 is, after decoded by a decoder 12, fed to a control circuit 20. When, for example, any data in a second memory area $M_2$ is read out onto a first memory plane area $M_1$, a readout instruction RPL is supplied from the decoder 12 to a selection gate circuit 21 in the control circuit 20. The selection gate circuit 21 receives a block number designating signal from the register 11 through the decoder 22 and supplies a readout signal to any specific block of the second memory area $M_2$ in a memory 30 through a driver circuit 23. In this way, a state for reading out data from the second memory plane area $M_2$ onto the first memory plane area $M_1$ is established. In this case, a register 24 for receiving a block designating signal from the decoder 22 is set by the output signal of the decoder 12 to cause a write prohibiting signal to be supplied to a predetermined block in the first memory plane area $M_1$, thereby prohibiting a write operation for a corresponding block of the first memory plane area from outside. This prevents any data from being erroneously written from outside. As a result, a data in a designated block in the second memory plane area is prevented from being destroyed. Where the first and second memory plane areas $M_1$ and $M_2$ are each formed to have, for example, four blocks, the register 24 may be formed to have four output lines so that a write prohibiting signal can be supplied to a designated block of the first memory plane area through a corresponding output line of the register 24.

The operation of the control circuit 20 effected when data is written, according to a write instruction in a program, onto the second memory plane area $M_2$ through the first memory plane area $M_1$ is the same as when the above-mentioned readout operation is effected.

Where a fixed data release instruction RLS for releasing a fixed data in a predetermined block is entered in a program, a release instruction RLS signal is supplied from the decoder 12 to the register 24, causing the register 24 to be made in the reset state. This causes the memory 30 to be set into a write-in state.

The read/write operation of the memory 30 is effected by supplying output signals of an address signal generator 25 and read/write signal generator 26 to the first memory plane area. The address signal generator 25 is adapted to receive an address data signal from the register 11 and the read/write signal generator 26 is adapted to receive an output signal from the decoder 12. A data register 13 in the processing unit 10 is connected via a data bus 31 to the first memory plane area $M_1$ to permit information transfer.

In the operation described above, a data read/write operation for the first and second memory plane areas $M_1$ and M2 is effected by beforehand incorporating the instructions RPL and RLS into the program. However, this method exerts a greater load on the programming. A general practice is to merely enter an address in a program and in this case it is necessary to use a control circuit in which operations corresponding to the above-mentioned instructions RPL and RLS are automatically effected by deriving a block address from the address of the program.

FIG. 7 shows a control flow chart for such a control circuit.

Such control circuit has an address/block number exchange table. A step 200 confirms which block in the memory corresponds to an address given when an access request is made. At a step 201 confirmation is made as to whether the state in the block belongs to a write inhibiting fixed data memory area or a working memory area. That is, the step 201 confirms whether the conditions of the access request are satisfied, or whether the access request meets with the present state of the block. When the conditions of the access request are met the process goes to a step 202 where a control signal necessary for a desired operation is generated. When on the other hand the conditions of the access request are not met and in consequence a readout instruction RPL is required, the process is shifted from the step 201 through the step 203 to the step 204, where a data in a predetermined block of the first memory plane area $M_1$ is transferred to the other working memory area. At a step 205 the contents of the exchange table are so changed that a block number corresponding to the address number is replaced by a block number on the new working memory area. At a step 206 a signal necessary for the execution of a readout instruction RPL is generated and at a step 207 a predetermined block in the first memory plane area $M_1$ is set to a write inhibiting state and then the step 202 follows the step 207.

Where no fresh readout instruction is required at the step 203, confirmation is made at a step 208 as to whether any block having an available working memory area is present or not. If the answer is in the affirmative, the block numbers on the exchange table are rewritten at a step 209. In this case, the step 202 follows the step 209. If on the other hand the answer is in the negative, a step 210 selects one of blocks in which fixed data are stored and a data on this block in the first memory plane area $M_1$ is written onto the second memory plane area $M_2$. At a step 211 the block in the first memory plane area $M_1$ is cleared and used as a working memory area. At a step 212 the block numbers on the exchange table are rewritten and the process goes to the step 202.

Since according to this invention a memory having a plurality of memory plane areas is used as mentioned above, it is possible to effectively reduce a memory capacity as required by a computer in processing a predetermined amount of information. Where, for example, in the prior art there are required a memory area for storing an N-word fixed data and a working memory area for a minimum N/2 word, it is necesssary to provide a memory capacity corresponding to at least 3N/2 word. According to this invention, however, it is only necessary to provide a memory capacity corresponding to the N word. Therefore, the memory capacity is reduced to two-thirds. A percentage in a decrease of the memory capacity is further heightened with an increase in the number of blocks and working memory areas.

Although only one second memory plane area has been explained for brevity, it will be apparent that, even when a plurality of second memory plane areas are used, the same operation as explained above is obtained. The first memory plane area, though shown as a volatile memory, may be constructed as a nonvolatile memory. This invention can be modified in a variety of ways without departing from the spirit and scope of this invention.

What we claim is:

1. A memory and control circuit for the memory comprising:
   a memory including a first memory plane area having a plurality of semiconductor memory cell elements and a second memory plane area superimposed on said first memory plane area and having a plurality of non-volatile memory cell elements formed of insulated gate field effect semiconductor devices each having a gate electrode, said first and second memory plane areas being each divided into a plurality of blocks and the memory cell elements of the first memory plane area being respectively connected to the corresponding memory cell elements of the second memory plane area in one-to-one correspondence to permit data transfer between the memory cell element of the first memory plane area and the corresponding memory cell element of the second memory plane area;
   address designating means connected to the first memory plane area to designate an address of the memory cell element of the first memory plane area;
   a control signal generator for generating a read/write control signal to cause the first memory plane area to be set to a write or readout mode; and
   control means connected to the gate electrodes of said non-volatile memory cell elements for initiating data transfer between that memory cell element in the first memory plane area which is addressed by said address designating means and the corresponding memory cell element in the second memory plane area, said blocks being controlled independently from each other.

2. A memory and control circuit for the memory according to claim 1, further including block designating means for selectively designating the blocks in the second memory plane area.

3. A memory and control circuit for the memory according to claim 2, further including block signal generating means for generating a block signal representing a block to be designated and said block designating means designates a selected block according to the block signal of the block signal generating means.

4. A memory and control circuit for the memory according to claim 3, in which there are further included block signal generating means for generating a block signal representing a block to be designated, means for selectively designating the blocks of the second memory plane area according to the block signal of said block signal generating means, and a register storing a block signal from said block signal generating means and selectively generating, in response to an output signal from said control means, write prohibiting signal to that block of the first memory plane area which corresponds to the block signal stored.

5. A memory and control circuit for the memory according to claim 1, wherein said plurality of memory cell elements of said first memory plane area are formed to constitute a random access memory.

6. A memory and control circuit for the memory according to claim 1, further including block designating means for selectively designating the blocks in the second memory plane area.

7. A memory and control circuit for the memory according to claim 6, further including block signal generating means for generating a block signal representing a block to be designated and said block designating means designates a selected block according to the block signal of the block signal generating means.

8. A memory and control circuit for the memory according to claim 1 in which said first and second memory plane areas are each divided into a plurality of blocks and data transfer between the first and second memory plane areas is effected for each block, and in which there are further included block signal generating means for generating a block signal representing a block to be designated, means for selectively designating the blocks of the second memory plane area according to the block signal of said block signal generating means, and a register storing a block signal from said block signal generating means and selectively generating, in response to an output signal from said control means, write operation inhibiting signal.

9. A memory and control circuit for the memory comprising:
   a memory including a first memory plane area having a plurality of semiconductor memory cell elements and a plurality of second memory plane areas superimposed one over the other on said first memory plane area and each having a plurality of nonvolatile memory cell elements formed of insulated gate field effect semiconductor devices each having a gate electrode, said first and second memory plane areas being each divided into a plurality of blocks and the memory cell elements of the first memory plane area being respectively connected to the corresponding memory cell elements of each of the second memory plane areas to permit data transfer between the memory cell element of the first memory plane area and the corresponding memory cell element each of the second memory plane areas;
   address designating means connected to the first memory plane area to designate an address of the memory cell element of the first memory plane area;
   a control signal generator for generating a read/write control signal to cause the first memory plane area to be set to a readout or write mode; and
   control means connected to the gate electrodes of said non-volatile memory cell elements for initiating data transfer between that memory cell element of the first memory plane area which is designated by said address designating means and the corresponding memory cell element in each of the second memory plane areas, said blocks being controlled independently from each other.

10. A memory and control circuit for the memory according to claim 9, wherein said plurality of memory cell elements of said first memory plane area are formed to constitute a random access memory.

11. A memory and control circuit for the memory according to claim 9, further including block designating means for selectively designating the blocks in the second memory plane area.

12. A memory and control circuit for the memory according to claim 11, further including block signal generating means for generating a block signal representing a block to be designated and said block designating means designates a selected block according to the block signal of the block signal generating means.

13. A memory and control circuit for the memory according to claim 9 in which said first and second memory plane areas are each divided into a plurality of blocks and data transfer between the first and second memory plane areas is effected for each block, and in which there are further included block signal generating means for generating a block signal representing a block to be designated, means for selectively designating the blocks of the second memory plane area according to the block signal of said block signal generating means, and a register storing a block signal from said block signal generating means and selectively generating in response to an output signal from said control means, write prohibiting signals to that block of the first memory plane area which corresponds to the block signal stored.

* * * * *